(12) United States Patent
Watanabe

(10) Patent No.: US 6,259,027 B1
(45) Date of Patent: Jul. 10, 2001

(54) COMPACT WIRE HARNESS FOR CONNECTING ELECTRICAL EQUIPMENT

(75) Inventor: Hiroshi Watanabe, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/262,844

(22) Filed: Mar. 5, 1999

(30) Foreign Application Priority Data

Mar. 16, 1998 (JP) .................................................. 10-065519
Nov. 30, 1998 (JP) .................................................. 10-340004

(51) Int. Cl.$^7$ ..................................................... H01B 3/00
(52) U.S. Cl. ...................... 174/72 A; 174/101; 174/68.3; 361/826; 361/827
(58) Field of Search ............................... 174/72 A, 72 R, 174/101, 68.3, 70 R; 361/826, 827, 828; 307/10.1

(56) References Cited

U.S. PATENT DOCUMENTS

| | | | |
|---|---|---|---|
| 4,958,260 | * | 9/1990 | Kobayashi et al. ................... 361/398 |
| 5,089,794 | * | 2/1992 | Norimatsu ............................... 331/68 |
| 5,106,040 | * | 4/1992 | Cafmeyer et al. ....................... 248/73 |
| 5,805,402 | * | 9/1998 | Maue et al. ............................. 361/93 |
| 5,936,818 | * | 8/1999 | Maue et al. ............................. 361/93 |
| 6,027,679 | * | 2/2000 | O'Brien et al. .................. 264/272.14 |

* cited by examiner

Primary Examiner—Dean A. Reichard
Assistant Examiner—W. David Walkenhorst
(74) Attorney, Agent, or Firm—Sughrue, Mion, Zinn, Macpeak & Seas, PLLC

(57) ABSTRACT

The wire harness can be fabricated in a simple assembling process, has a compact shape, and is capable of reducing the number of times the wire harness is fitted to connectors. In such a wire harness for distributing a power source and a signal in a unit of electrical equipment or a unit of an electrical equipment system, a substrate having at least one electronic component and configuring an internal circuit is interposed midway in a route of a trunk line of the wire harness, and the substrate has a terminal for causing an electric wire of the trunk line to be electrically connected to the internal circuit, the electric wire being made to branch off from the trunk line by means of the terminal.

6 Claims, 3 Drawing Sheets

COMPACT WIRE HARNESS FOR CONNECTING ELECTRICAL EQUIPMENT

BACKGROUND OF THE INVENTION

1. Field of the Invention

The present invention relates to a wire harness for connecting electrical equipment, and more particularly to a technique for making a wire harness compact and reducing the number of times connectors are fitted.

2. Description of the Prior Art

In a conventional wire harness, a system is adopted in which the wire harness is divided into a plurality of blocks, and the blocks are respectively designed and fabricated as a unit. Namely, a one-block wire harness 30 shown in FIG. 4 is provided with main junction boxes 32a and 32b at opposite ends of a trunk line 31. The one-block harness 30 is connectable to wire harnesses, or the like, of other blocks.

Further, a multiplicity of branch lines 33a to 33h branch off from the trunk line 31 by being spliced to required wires of the trunk line 31 (by connecting the wires). These branch lines are each provided with a connector 34 or a sub-junction box 35, and secondary branch lines 36a to 36c are spliced to the branch line 33e, as necessary.

This wire harness 30 is arranged to be connected to electrical equipment or wire harnesses of other blocks by means of the main junction boxes 32a and 32b, the sub-junction boxes 35, the connectors 34, and the like.

However, with such a conventional wire harness, it has been necessary to provide a plurality of connector-accommodating portions inside the junction boxes in order to fit a plurality of connectors by means of the junction boxes. In a case where the number of connections of the connectors is numerous, the junction boxes become large in size, which has been a factor substantially reducing the degree of freedom in the installation of the wire harness.

In addition, since the branching of the route is effected mainly by the junction boxes, the number of connections of the connectors naturally increases. For this reason, not only does the assembling operation using the wire harness become complicated, but there are cases where measures for waterproofing, dust prevention, abnormal noise, and so forth are required in connector-connecting portions, which constitute an important factor for increasing costs.

Meanwhile, although it is possible to make the wire harness compact by forming the branches by splicing, since the splicing itself is a difficult process, the number of processes for fabricating the wire harness increases, and there arise problems which make the automatic assembly of the wire harness difficult.

SUMMARY OF THE INVENTION

The present invention has been devised in view of the above-described conventional problems, and its object is to provide a wire harness which can be fabricated in a simple assembling process, has a compact shape, and is capable of reducing the number of times the wire harness is fitted to connectors.

To attain the above object, there is provided a wire harness for distributing a power source and a signal in a unit of electrical equipment or a unit of an electrical equipment system, characterized in that a small-size substrate having at least one electronic component and configuring an internal circuit is interposed midway in a route of a trunk line of the wire harness.

In this wire harness, the wire harness is able to demonstrate not only the function of electric wires but also the functions of electronic components. For this reason, it is possible to substantially reduce block connections, and the like, for providing various functions, so that the wire harness can be made compact, the number of times connectors and the like are fitted can be reduced, and the assembling operation can be further simplified.

The small-size substrate of the wire harness has a terminal for causing an electric wire of the trunk line to be electrically connected to the internal circuit, an electric wire being made to branch off from the trunk line by means of the terminal.

With this wire harness, since it is possible to disuse branching by means of connector fitting and branching by means of splicing, the arrangement of the wire harness can be simplified, thereby making it possible to reduce the number of connections of the connectors without impairing the degree of freedom of installation. In addition, it is possible to reduce the number of steps for the fabrication of the wire harness, and the automatic assembly can be facilitated.

The small-size substrate may have cutout portions on side surfaces of the substrate. In this wire harness, since the tape bites into the cutout portions and the substrate is thereby fixed when the outer periphery of the substrate is wrapped around and coated by the tape, the substrate can be coated more reliably without causing the tape to slip off.

The small-size substrate may have wall portions provided uprightly in such a manner as to project in a projecting direction of the terminal on both end sides of the small-size substrate where the terminal is arranged.

In this wire harness, the wall portions provided uprightly on both end sides of the terminal of the small-size substrate make it possible to prevent the tape from being torn off by the projection of the terminal, and the coating of the small-size substrate can be held more stably.

The terminal can be formed separately from the small-size substrate, and electrically connected by being retained at the small-size substrate after the electric wire is connected to the terminal.

In this wire harness, since the terminal is formed separately from the small-size substrate, the connection of the wire to the terminal can be facilitated, and the operating efficiency can be improved.

A plurality of the terminals may be disposed on a plate. In this wire harness, since a plurality of terminals are provided on the plate, the step of wiring with respect to the small-size substrate is remarkably facilitated by merely attaching the plate, so that the operating efficiency can be improved substantially, and the small-size substrate can be replaced simply.

A wall portion projecting from the small-size substrate may be formed on each end portion of the plate. In this wire harness, since a wall portion is formed on each end portion of the plate, it becomes unnecessary to provide wall portions on the small-size substrate, so that the arrangement of the small-size substrate can be simplified.

The plate may be fixed to the small-size substrate as a retainer formed on the plate is inserted in a retaining hole formed in the small-size substrate. In this wire harness, the terminal on the plate can be accurately positioned with respect to the small-size substrate by inserting the retainer on the plate into the retaining hole in the small-size substrate, so that the wire can be electrically connected to the small-size substrate simply and reliably.

DETAILED DESCRIPTION OF THE INVENTION

Figure 1:
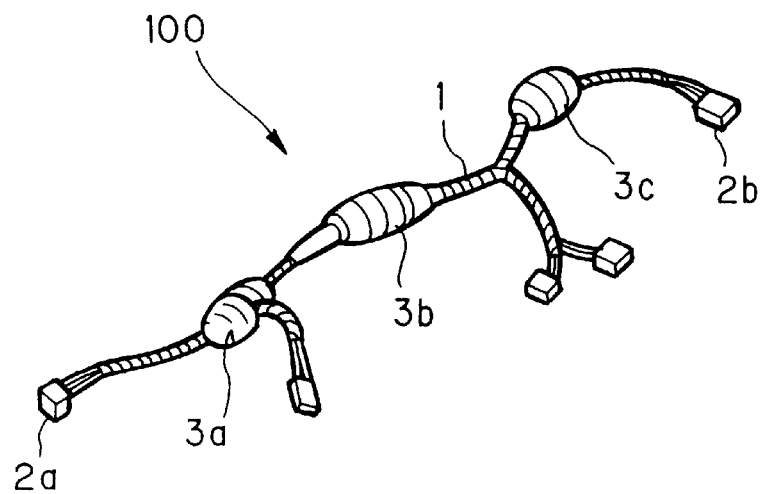
FIG. 1 is an overall schematic diagram of a wire harness in accordance with each embodiment of the present invention.

Referring now to the drawings, a detailed description will be given of an embodiment of the wire harness in accordance with the present invention.

Figure 2:
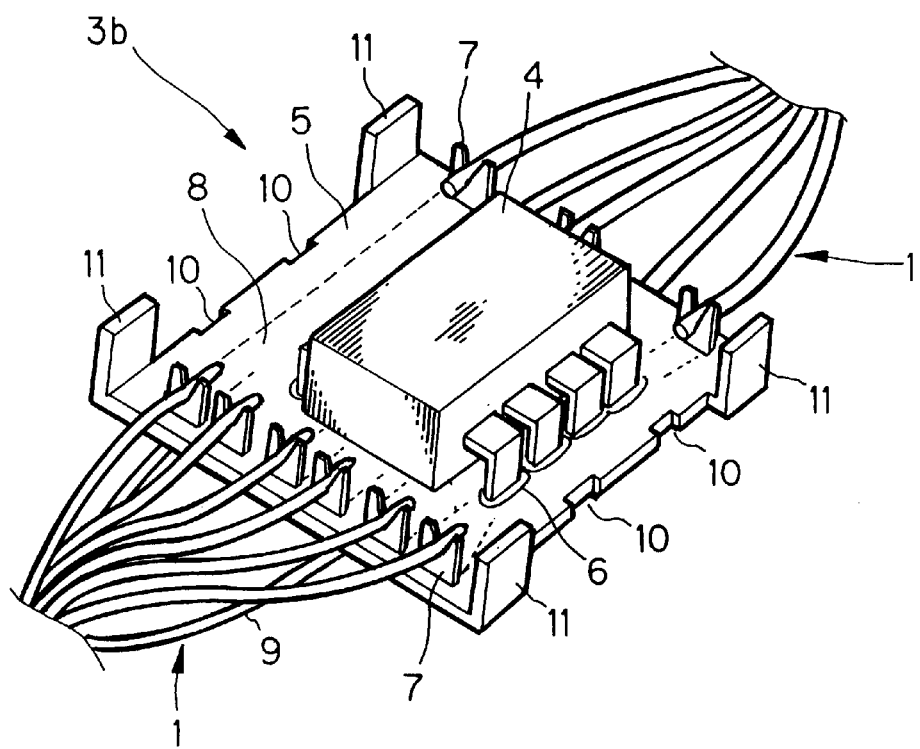
FIG. 2 is an enlarged perspective view for explaining the internal structure of a substrate portion in accordance with a first embodiment.

FIG. 1 is an overall schematic diagram illustrating a first embodiment of the wire harness in accordance with the present invention, and FIG. 2 is an enlarged perspective view illustrating an internal structure of a substrate shown in FIG. 1.

The wire harness in this embodiment shares the functions of a conventional junction box provided in the wire harness, and small-size substrates, on which electronic components having the functions of connecting electrical equipment or connecting wire harnesses of other blocks are mounted, are arranged in a dispersed manner within the harness, thereby allowing the wire harness to be provided with not only the functions of electric wires but also the functions of electronic components. In addition, the small-size substrates are provided with the functions of branching the electric wires.

A wire harness 100 shown in FIG. 1 has connectors 2a and 2b provided on both ends of a trunk line 1 so as to connect electrical equipment or wire harnesses of other blocks, and substrate portions 3a, 3b, and 3c having small-size substrates with chip components and the like mounted thereon are provided midway in the route of the trunk line 1.

A tape is wound around the surfaces of the substrate portions 3a, 3b, and 3c to provide a coating therefor, whereby the interiors of the substrate portions are protected and the substrate portions are fixed to the trunk line 1 with sufficient connecting strength. Functions of electronic components, which are not provided in electric wires only, are added to these substrate portions 3a, 3b, and 3c.

Referring next to FIG. 2, a description will be given of the internal structure of the substrate portion. FIG. 2 is a perspective view illustrating the internal structure of the substrate portion 3b which is shown in FIG. 1 and around which the tape is wound. Since the substrate portions 3a and 3c are arranged substantially in the same way as the substrate portion 3b, a description will be given herein by citing the substrate portion 3b as an example.

In FIG. 2, a chip component 4, which is an electronic component, is inserted in holes 6 formed in a small-size substrate 5, and electric wires of the trunk line 1 are connected to terminals 7 provided on the small-size substrate 5.

A circuit pattern 8 is formed on the small-size substrate 5, and the pattern 8 is provided with various functions including, for example, a joint function for integrating signals at two terminals, as required.

With the chip components 4, it is possible to provide various component parts, such as ICs, resistors, and capacitors, and as their functions it is possible to cite a multiple node, a relay, a fuse, and the like. In addition, an arrangement may be provided such that one or a plurality of electronic components, such as ICs, resistors, and capacitors, are mounted on the small-size substrate 5, as necessary. Further, if the IC is formed as an integrated circuit of a compact size and a high density, such as a ball grid array (BGA) and a chip size package (CSP), it is possible to realize a more highly sophisticated function on the small-size substrate. This chip component 4 is provided so as to function as a unit of electrical equipment connected to the wire harness or as a unit of an electrical equipment system which is an aggregate of a plurality of electrical equipment.

In addition, some of the electric wires of the trunk line 1 may be passing electric wires 9 which are not connected to the terminals 7 on the small-size substrate 5 and are passed through the small-size substrate 5.

In addition to the aforementioned holes 6, terminals 7, and circuit pattern 8, the small-size substrate 5 is provided with cutout portions 10 for stabilizing the fixation by the tape when the outer periphery of the small-size substrate 5 is coated by being wrapped around by the tape, the cutout portions 10 being provided orthogonally to the direction in which the wires are arranged. Further, wall portions 11 for preventing damage to the tape by the projections of the terminals 7 are similarly provided in the orthogonal direction. These cutout portions 10 and wall portions 11 are so arranged as to be easily formed on the small-size substrate 5 by punching and bending.

Due to the presence of the cutout portions 10, part of the tape bites into the cutout portions 10 during the winding of the tape, thereby allowing the small-size substrate 5 to be fixed to the trunk line more reliably. In addition, due to the presence of the wall portions 11, the tape is prevented from being torn off by the projections of the terminals 7.

Incidentally, wall portions for projections, such as lead legs of the chip component 4 projecting from the holes 6, may be provided on the rear surface of the small-size substrate 5.

Thus, as the tape is used for protecting and fixing the small-size substrate 5, it becomes unnecessary to attach a protector such as a terminal cover to the small-size substrate 5, and the substrate portion can be formed into a more compact shape than in the case where the cover is attached. In addition, since the electric wires can be easily connected to the terminals 7 by using a well-known technology, the number of steps for assembling the wire harness can be reduced, and it is possible to realize the automation of its assembly more simply.

The wire harness 100 of the above-described arrangement can be used for connecting vehicle-mounted electrical equipment, for example. The vehicle-mounted electrical equipment include, for instance, electrical equipment for controlling the driving of a vehicle such as an engine control unit, electrical equipment for a driving vehicle such as an air-conditioner, lighting equipment, a turn indicator light, and a wiper, and other electrical equipment such as audio equipment and related apparatuses. The wire harness of the present invention can be suitably used as a harness for connecting these electrical equipment.

It should be noted that the substrate portions of this wire harness 100 are desirably provided at the branching points at the trunk line of the wire harness or at both end portions of the harness from the standpoint of making the wire length the shortest, and such positions make it possible to arrange the wire harness with the greatest efficiency. In addition, the provision of the substrate portions at the branching points of the wire harness makes it easy to maintain the intervals between the branching positions at predetermined lengths. This facilitates the adjustment of the wire length, and makes it possible to further simplify the manufacturing process of the wire harness and the assembling operation of the wire harness.

In addition, in this wire harness 100, since branching is effected on the small-size substrates 5, it is unnecessary to use junction boxes, and since the small-size substrates 5 serving as the branching points are not provided with covers but are arranged to be coated by being wrapped around by the tape, the overall wire harness can be made substantially compact as compared with the case in which the junction boxes are used.

Furthermore, since the arrangement provided is such that the wires are directly led out from the small-size substrates 5, the fitting of the connectors can be confined to the connection of only the electronic equipment used, so that the number of times the connectors are fitted can be substantially reduced. Accordingly, the product manufacturing process for assembling the wire harness can be further simplified, and it is possible to attain a substantial cutback in the cost.

In addition, since spliced portions are not present in this wire harness, the splicing of the wires, which is a difficult manufacturing task, can be eliminated so that the manufacturing process of the wire harness can be simplified, and the automatic assembly of the wire harness can be effected easily.

Next, referring to FIG. 3, a description will be given of a second embodiment of the wire harness in accordance with the present invention.

Figure 3:
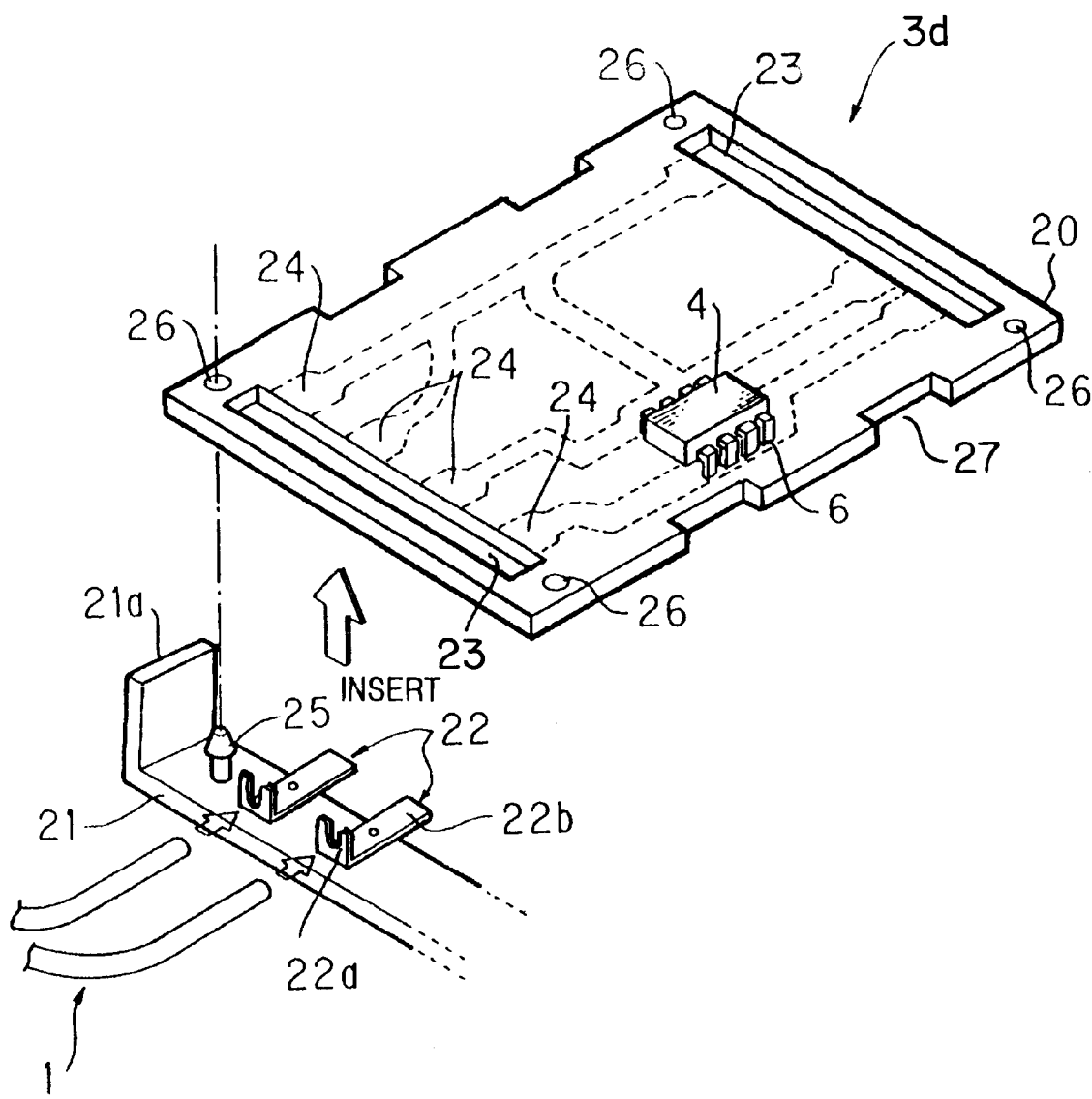
FIG. 3 is an enlarged perspective view for explaining the internal structure of a substrate portion in accordance with a second embodiment.
Figure 4:
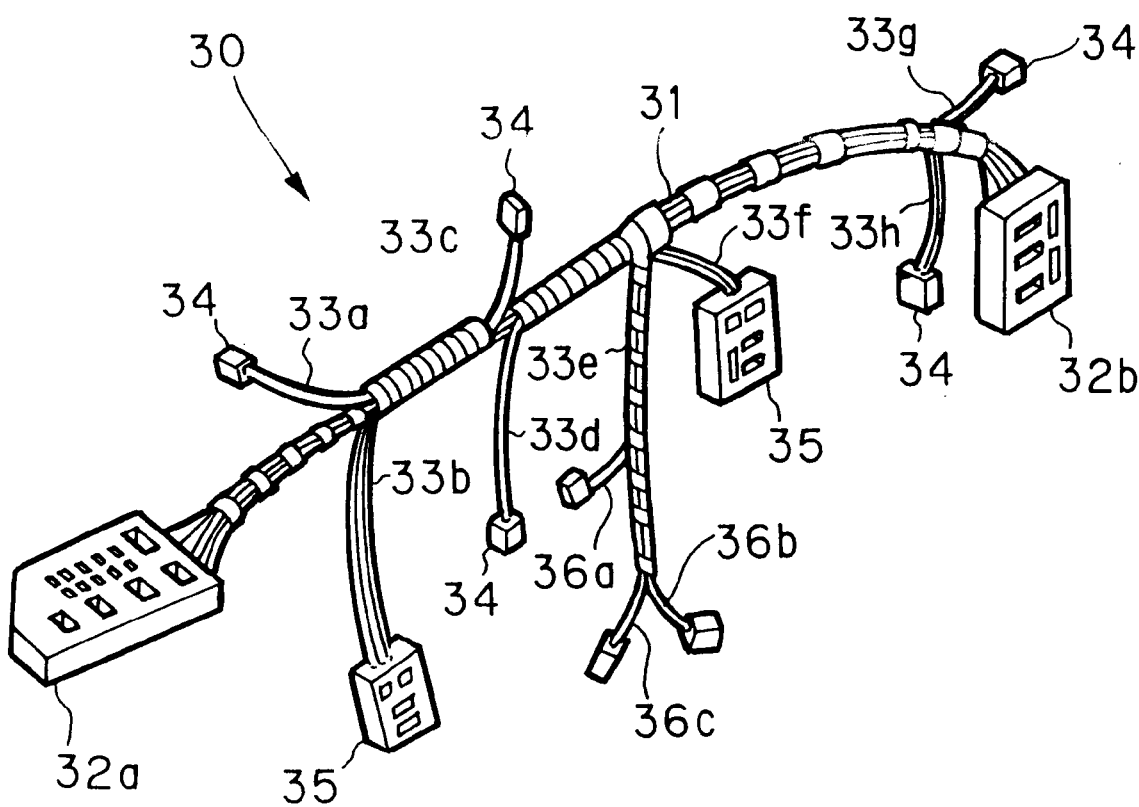
FIG. 4 is a diagram illustrating the configuration of a conventional wire harness.

FIG. 3 is an enlarged perspective view illustrating the internal structure of a substrate portion in the wire harness in this embodiment. In FIG. 3, in the same way as in the first embodiment, the chip component 4, which is an electronic component, is inserted in the holes 6 formed in a small-size substrate 20, and the wires of the trunk line 1 are connected to terminals 22 of a plate 21 provided separately from the small-size substrate 20. In this small-size substrate 20, the circuit pattern 8 is formed, and lands 24 serving as contacts are formed in the vicinities of a terminal hole 23 at an end portion of the small-size substrate 20.

Incidentally, the arrangement of the chip component 4 is not confined to the example shown in FIG. 3 in which one IC is provided, but a plurality of kinds of chip components may be mounted, and any other electronic components may be used as the chip components 4.

The plate 21 is fixed to the small-size substrate 20 as plate-retaining clips (retainers) 25 are inserted in plate-retaining holes (retaining holes) 26 in the small-size substrate 20 in the direction of the arrow after the wires are connected to the terminals 22. At this time, wire connecting portions 22a of the terminals 22 project from the terminal hole 23 in the small-size substrate 20, and contact portions 22b are joined to the lands 24 formed on the reverse side of the small-size substrate 20. The contact portions 22b and the lands 24 are electrically connected by joining with an electrically conductive material such as solder, joining by spot welding, or connecting by being urged by the resiliently restoring force of the terminals 22.

Further, wall portions 21a of the plate 21 are provided uprightly substantially vertically from the surface of the small-size substrate 20 after being fixed to the small-size substrate 20, and their height is set to be higher than the wire connecting portions 22a projecting from the terminal hole 23.

Further, the small-size substrate 20 is provided with cutout portions 27 for stabilizing the fixation by the tape when its outer periphery is wrapped around and coated by the tape, the cutout portions 27 being provided orthogonally to the direction in which the wires are arranged.

The wall portions 21a of the aforementioned plate 21 make it possible to prevent the tape from being torn off by the projections of the terminals 22 with the wires connected thereto. The cutout portions 27 cause the tape to sink into them, thereby allowing the small-size substrate 20 to be fixed to the trunk line more reliably. In addition, the outside dimension after the tape winding and coating does not become large, so that the wire harness can be maintained with a predetermined compact size.

In accordance with the above-described arrangement of this embodiment as well, it is possible to obtain operation and effect similar to those of the first embodiment, and the manufacturing process of the wire harness can be simplified and can be made compact. In particular, even in cases where the small-size substrate 20 becomes large due to the enlargement of functions, and the number of wires used increases, since the wires are connected to the plates 21 which are formed separately from the small-size substrates 20, the operating efficiency can be enhanced as compared with the case where the individual wires are directly connected to the small-size substrates, making it possible to improve productivity. In addition, in operations such as maintenance, the small-size substrate 20 can be easily replaced by removing the plate 21 from the small-size substrate 20 without needing to detach the wires, so that the operation can be simplified substantially.

As described above, in accordance with the present invention, in the distribution of a power source and a signal which is effected in a unit of electrical equipment or a unit of an electrical equipment system, a small-size substrate having at least one electronic component and configuring an internal circuit is interposed midway in the route of the trunk line of the wire harness. Therefore, the wire harness is made compact, and the degree of freedom in the installation of the wire harness can be improved. In addition, the assembly of the wire harness can be further simplified.

In addition, the small-size substrate has a terminal for causing the electric wire of the trunk line to be electrically connected to the internal circuit, and an electric wire connected to the terminal is made to branch off from the trunk line. Therefore, the number of connections of the connectors can be reduced substantially. Hence, the cost can be lowered, and the assembling operation such as the connection of equipment using the wire harness can be effected more simply.

Further, since cutout portions are formed on side surfaces of the small-size substrate, the winding and coating of the tape can be made more reliable. Furthermore, since wall portions are formed on both end portions of the terminal, it is possible to prevent the tape from being torn off by the projections of the terminal.

In addition, the terminal is formed on a plate separately from the small-size substrate, and a retainer formed on the plate is inserted in a retaining hole formed in the small-size substrate. Therefore, the connection of the wire to the terminal can be facilitated, the plate can be accurately positioned with respect to the small-size substrate and fixed thereto in a simple manner, so that the operating efficiency can be improved substantially.

What is claimed is:

1. A wire harness for distributing a power source and a signal in a unit of electrical equipment or a unit of an electrical equipment system, comprising:

a substrate having at least one electronic component and an internal circuit, interposed along a route of a trunk line of the wire harness, wherein said substrate has a terminal for causing an electric wire of said trunk line to be electrically connected to said internal circuit, the electric wire branching off from said trunk line by means of said terminal and wherein said terminal is formed separately from said substrate, and is electrically connected by being retained by said substrate after the electric wire is connected to said terminal.

2. The wire harness according to claim 1, wherein said substrate has cutout portions on side surfaces of said substrate.

3. wire harness according to claim 1, wherein said substrate has wall portions extending from ends of said substrate to be near said terminal wherein said wall portions project in the same direction as said terminal.

4. The wire harness according to claim 1, wherein a plurality of said terminals are disposed on a plate, wherein said plate is engageable with said substrate.

5. The wire harness according to claim 4, wherein a wall portion projecting from said substrate is formed on opposing end portions of said plate.

6. The wire harness according to claim 4 or 5, wherein a retainer formed on said plate is inserted in a retaining hole formed in said substrate so as to fix said plate to said substrate.

\* \* \* \* \*